United States Patent
Chen et al.

(10) Patent No.: US 7,105,453 B2
(45) Date of Patent: Sep. 12, 2006

(54) METHOD FOR FORMING CONTACT HOLES

(75) Inventors: Yi-Nan Chen, Taipei (TW); Tse-Yao Huang, Taipei (TW); Hui-Min Mao, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 414 days.

(21) Appl. No.: 10/783,467

(22) Filed: Feb. 20, 2004

(65) Prior Publication Data

US 2005/0106887 A1  May 19, 2005

(30) Foreign Application Priority Data

Nov. 17, 2003  (TW) .............................. 92132103 A

(51) Int. Cl.
*H01L 21/302* (2006.01)
*H01L 21/3065* (2006.01)

(52) U.S. Cl. ..................... 438/700; 438/703; 438/706

(58) Field of Classification Search ................ 438/700, 438/703, 706

See application file for complete search history.

(56) References Cited

U.S. PATENT DOCUMENTS

| 6,281,059 B1* | 8/2001 | Cheng et al. ............... 438/200 |
| 6,426,256 B1* | 7/2002 | Chen .......................... 438/256 |
| 6,451,708 B1* | 9/2002 | Ha ............................. 438/738 |
| 6,534,361 B1* | 3/2003 | Lee ............................ 438/253 |

* cited by examiner

*Primary Examiner*—Nadine G. Norton
*Assistant Examiner*—Lynette T. Umez-Eronini
(74) *Attorney, Agent, or Firm*—Quintero Law Office

(57) ABSTRACT

A method of forming contact holes. A substrate on which a plurality of gate structures is formed is provided, wherein the gate structure comprises a gate, a gate capping layer, and a gate spacer. An insulating layer is formed on the gate structures and fills between the gate structures. The insulating layer is etched using the gate capping layers, the gate spacers, and the substrate as stop layers to form first contact holes between the gate structures to expose the substrate and the gate spacers and form second contact holes overlying each gate structure to expose the gate capping layers. A protective spacer is formed over each sidewall of the first contact holes and the second contact holes. The gate capping layer under each gate contact hole is etched using the protective spacer as a stop layer to expose the gate. The protective spacers are removed.

26 Claims, 6 Drawing Sheets

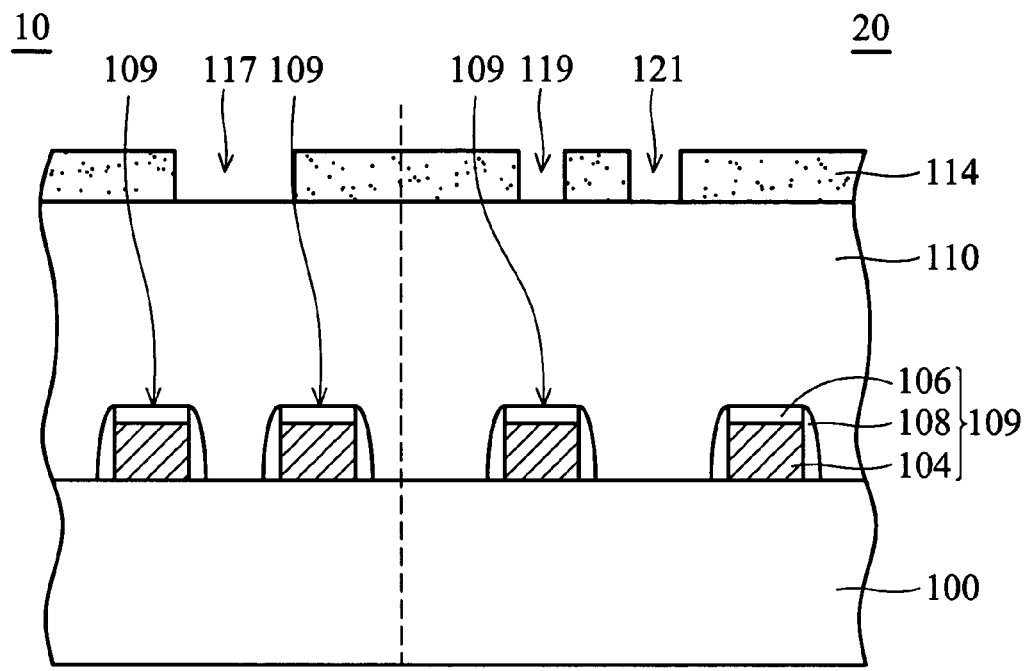
FIG. 1a ( RELATED AT )
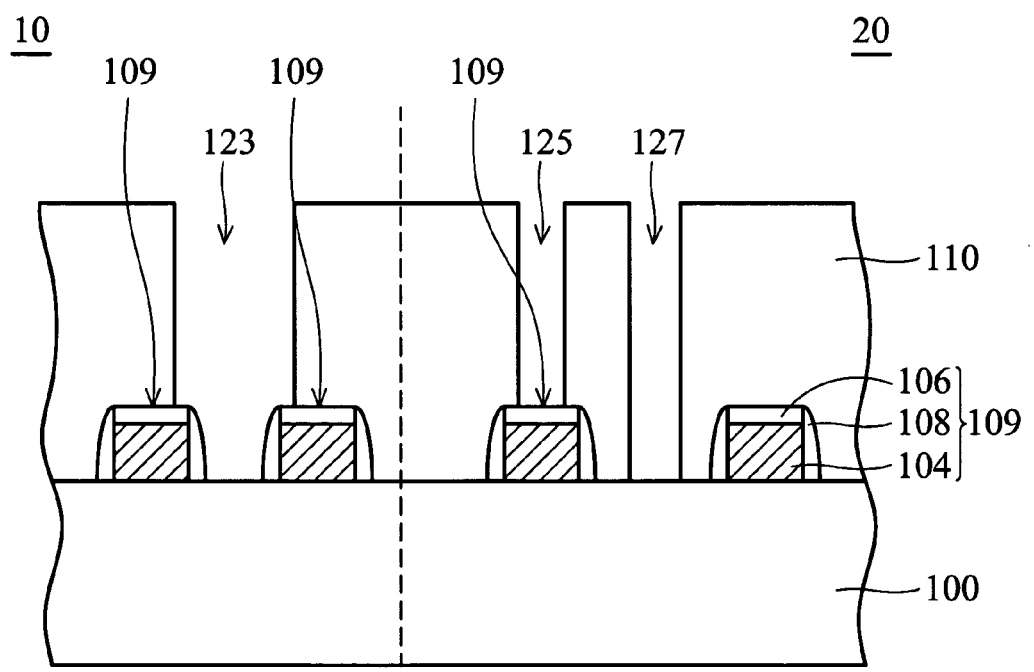
FIG. 1b ( RELATED AT )

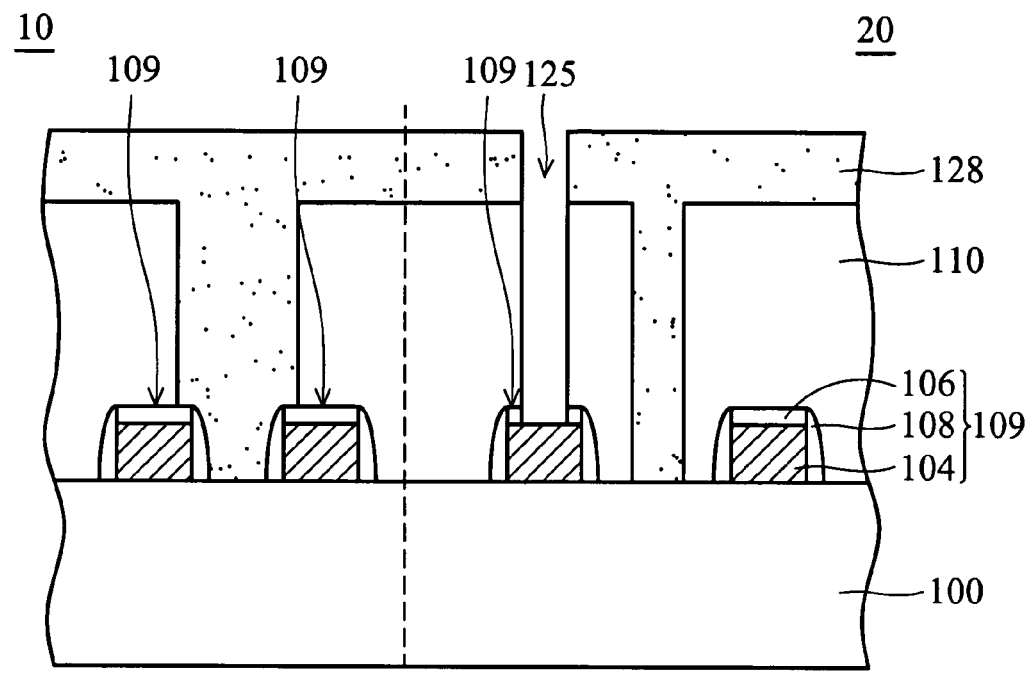
FIG. 1c ( RELATED AT )
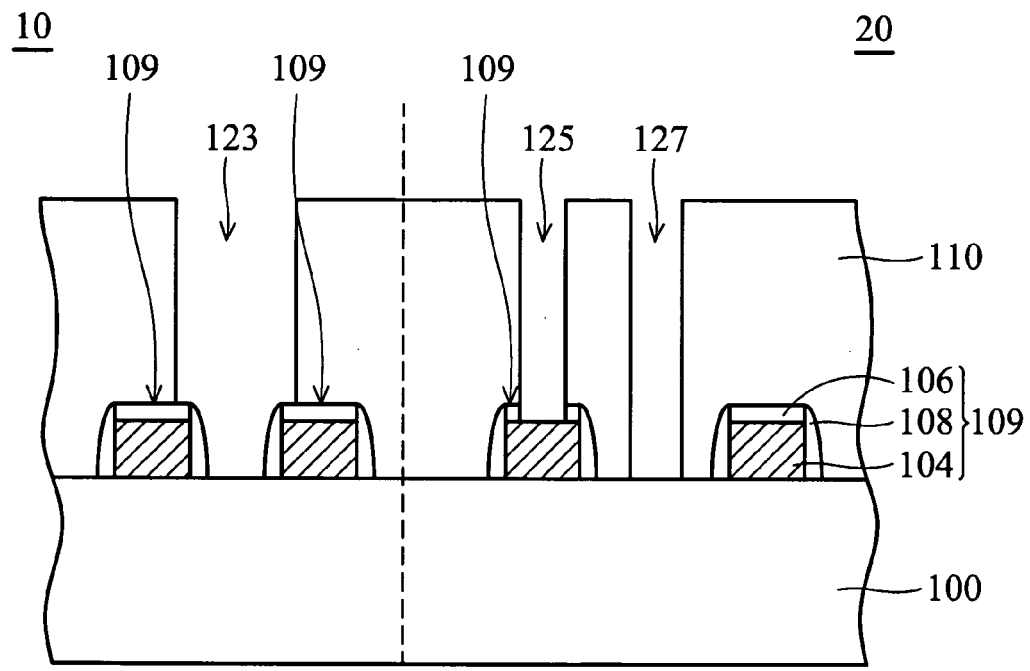
FIG. 1d ( RELATED AT )

METHOD FOR FORMING CONTACT HOLES

BACKGROUND OF THE INVENTION

1. Field of the Invention

The present invention relates in general to a method for forming contact holes, and more particularly, to a method for forming contact holes for a memory device.

2. Description of the Related Art

As semiconductor device geometries continue to decrease in size to provide more devices per fabricated wafer and faster devices, misalignment between each patterned layer is a serious obstacle. Therefore, many self-aligned processes have been developed in order to prevent misalignment and decrease the interval between devices, thereby increasing the device density.

FIGS. 1a to 1d are cross-sections showing a conventional method of forming contact holes for a memory device. First, in FIG. 1a, a silicon substrate 100 is provided. The substrate 100 may contain any semiconductor device, such as MOS transistors and capacitors, used in the memory devices. Here, in order to simplify the diagram, only a flat substrate is depicted. Moreover, the substrate 100 has a memory array region 10 and a peripheral circuit region 20.

Next, a plurality of gate structures 109 is formed overlying the memory array region 10 and the peripheral circuit region 20, wherein the gate structure 109 comprises a gate dielectric layer (not shown), a gate 104, a gate capping layer 106, and a gate spacer 108. The gate dielectric layer may be a silicon oxide layer formed by thermal oxidation. The gate 104 may comprise polysilicon. The gate capping layer 106 and the gate spacer 108 may comprise silicon nitride.

Thereafter, an insulating layer 110, such as a borophosphosilicate glass (BPSG) layer, is formed on the gate structures 109 and fills the gaps therebetween to serve as an interlayer dielectric (ILD) layer. Next, a photoresist layer 114 is coated on the insulating layer 110 and lithography is performed to form openings 117, 119, and 121 therein to expose the insulating layer 110.

Next, in FIG. 1b, the insulating layer 110 under the openings 117, 119, and 121 is etched using the photoresist layer 114 as an etch mask and using the gate capping layers 106, the gate spacers 108, and the substrate 100 as stop layers to simultaneously form bit line contact holes ($C_B$) 123 on the memory array region 10 to expose the substrate 100 and the gate spacers 108 and form substrate contact holes ($C_S$) 127 and gate contact holes ($C_G$) 125 on the peripheral circuit region 20 to expose the substrate 100 and the gate capping layers 106, respectively.

Next, in FIG. 1c, after the photoresist layer 114 is removed, a photoresist layer 128 is coated on the insulating layer 110 and fills the bit line contact holes 123, the substrate contact holes 127, and the gate contact holes 125. Next, lithography is performed to remove the photoresist layer 128 in the gate contact holes 125.

Finally, in FIG. 1d, the gate capping layers 106 under the gate contact holes 125 are etched using the remaining photoresist later 128 as an etch mask to expose the gate 104, thereby completing the fabrication of the gate contact holes 125. Thereafter, the remaining photoresist layer 128 is removed.

However, in this method, in order to prevent damaging the gate capping layer 106 and the gate spacer 108 under the bit line contact hole 123 during etching the gate capping layer 106 under the gate contact hole 125, an additional masking layer 128 must be formed by lithography. As a result, the fabrication of contact holes is complicated, increasing fabricating cost. Moreover, misalignment may occur easily when the additional masking layer is formed, reducing device yield.

SUMMARY OF THE INVENTION

Accordingly, an object of the present invention is to provide a novel method of forming contact holes for a memory device, wherein a protective spacer is formed over the sidewall of the bit line contact hole in the memory device, rather than an additional masking layer when forming gate contact hole, thereby simplifying the fabrication of contact holes to reduce fabricating cost and increase the device yield.

According to the object of the invention, a method of forming contact holes for a memory device is provided. First, a substrate having a memory array region and a peripheral circuit region is provided. A plurality of gate structures is formed overlying the array region and the peripheral circuit region, wherein the gate structure comprises a gate, a gate capping layer, and a gate spacer. Next, a first insulating layer is formed between the gate structures and a second insulating layer is formed on the gate structures and the first insulating layer. Thereafter, the second and first insulating layers are successively etched using the gate capping layers, the gate spacers, and the substrate as stop layers to form bit line contact holes on the memory array region to expose the substrate and the gate spacers and form substrate contact holes and gate contact holes on the peripheral circuit region to expose the substrate and the gate capping layers. Next, a protective spacer is formed over each sidewall of the bit line contact holes, the substrate contact holes, and the gate contact holes. Next, the gate capping layer under each gate contact hole is etched using the protective spacer as a stop layer to expose the gate. Finally, the protective spacers are removed.

In the gate structure, the gate can comprise a metal silicide layer and the gate capping layer and the gate spacer can comprise silicon nitride.

Moreover, the first insulating layer and the second insulating layer can be borophosphosilicate glass (BPSG) and tetraethyl orthosilicate (TEOS) oxide layer, respectively.

Moreover, the protective spacer can be metal nitride with a thickness of about 80 to 200Å. Additionally, the protective spacer can be removed by a mixture of sulfuric acid and hydrogen peroxide (SPM).

Moreover, the gate capping layer can be etched using CH3F, O2, and CO as reaction gases.

DESCRIPTION OF THE DRAWINGS

The present invention will become more fully understood from the detailed description given hereinbelow and the accompanying drawings, given by way of illustration only and thus not intended to be limitative of the present invention.

FIGS. 1a to 1d are cross-sections showing a conventional method of forming contact holes for a memory device.

DETAILED DESCRIPTION OF THE INVENTION

FIGS. 2a to 2g are cross-sections showing a method of forming contact holes for a memory device, such as a dynamic random access memory (DRAM), according to the invention.

Figure 2A:
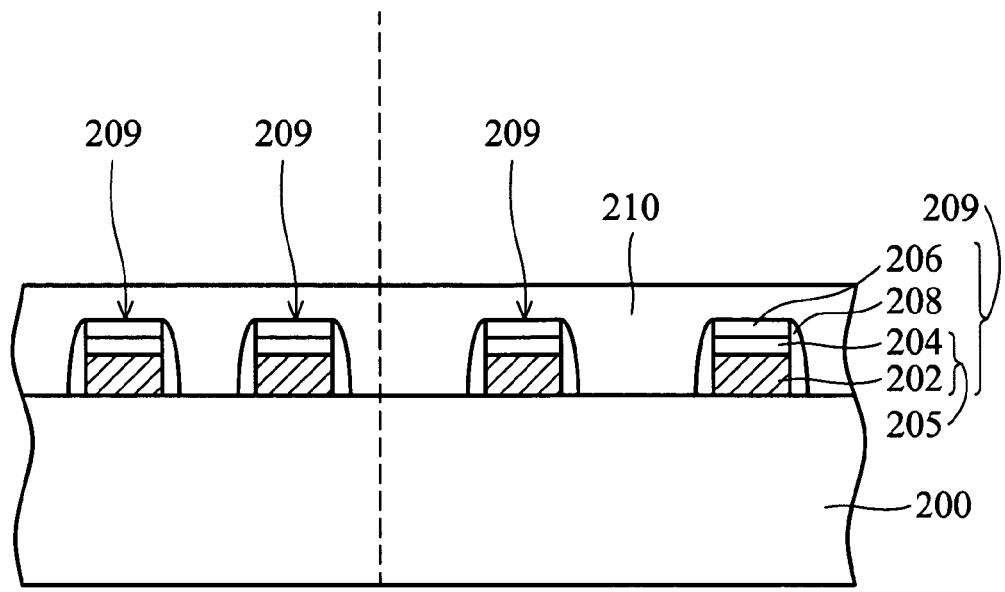
FIGS. 2a to 2g are cross-sections showing a method of forming contact holes for a memory device according to the invention.

First, in FIG. 2a, a substrate 200, such as a silicon wafer, is provided. The substrate 200 may contain semiconductor devices, such as MOS transistors and capacitors, used in the memory devices. Here, in order to simplify the diagram, only a flat substrate is depicted. Moreover, the substrate 200 has a memory array region 30 and a peripheral circuit region 40.

Next, a plurality of gate structures 209 is formed overlying the memory array region 30 and the peripheral circuit region 40 by conventional process, wherein the gate structure 209 comprises a gate dielectric layer (not shown), a gate 205, a gate capping layer 206, and a gate spacer 208. The gate dielectric layer may be a silicon oxide layer formed by thermal oxidation. The gate 205 may be a single polysilicon layer or a composite layer comprising a polysilicon layer and a metal silicide layer thereon. In the invention, for example, the gate 205 is a composite layer comprising a polysilicon layer 202 and a metal silicide layer 204 thereon. The gate capping layer 206 and the gate spacer 208 may comprise silicon nitride, wherein the gate capping layer 206 has a thickness of about 1500 to 1600Å.

Thereafter, a first insulating layer 210 is formed on the gate structures 209 and fills the gaps therebetween. In the invention, the first insulating layer 210 can be borophosphosilicate glass (BPSG) formed by chemical vapor deposition (CVD), with a thickness of about 7000 to 8000Å.

Figure 2B:
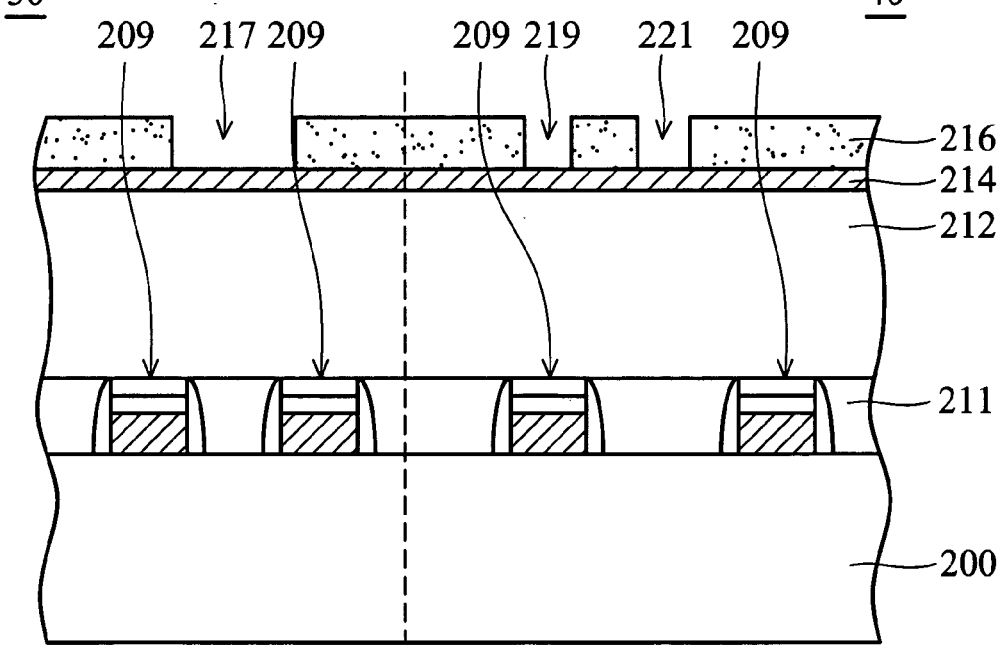

Next, in FIG. 2b, etching, by such as chemical mechanical polishing (CMP), is performed on the first insulating layer 210 using the gate capping layer 206 as a stop layer to leave a portion of first insulating layer 211 with a thickness of about 6600Å between the gate structures 209. Next, a second insulating layer 212 is subsequently formed on the gate structures 209 and the remaining first insulating layer 211. In the invention, the second insulating layer 212 may be tetraethyl orthosilicate (TEOS) oxide formed by CVD. Moreover, the second insulating layer 212 has a thickness of about 4500Å. Here, the first and second insulating layers 211 and 212 are used as an interlayer dielectric (ILD) layer. It is noted that the ILD layer may be a single layer composed of the same material as the first insulating layer 210.

Next, a photoresist layer 216 is coated on the second insulating layer 212 for defining patterns. In the invention, a polysilicon layer 214 with a thickness of about 600Å may be optionally formed on the second insulating layer 212 to serve as a hard mask before the photoresist layer 216 is coated thereon. Thereafter, conventional lithography is performed on the photoresist layer 216 to form openings 217, 219, and 221 therein and expose the hard mask 214. The opening 217 is positioned over the first insulating layer 211 between the gate structures 209 on the memory array region 30 and has a width of about 1550 to 1700Å. The opening 219 is positioned over the gate structures 209 on the peripheral circuit region 40 and has a width of about 1550 to 1680Å. The opening 221 is positioned over the first insulating layer 211 between the gate structures 209 on the peripheral circuit region 40 and has a width of about 1550 to 1700Å.

Figure 2C:
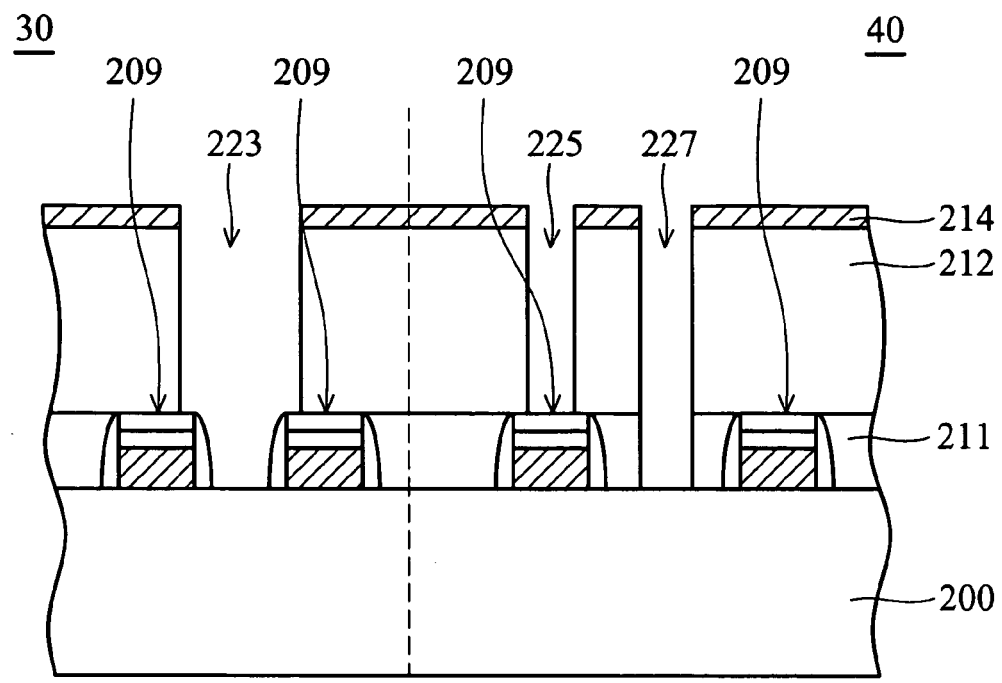

Next, in FIG. 2c, the opening patterns 217, 219, and 221 of the photoresist layer 216 are transferred onto the hard mask 214. Thereafter, the photoresist layer 216 is removed. The second insulating layer 212 and the first insulating layer 211 are successively etched using the hard mask 214 with opening patterns as an etch mask and using the gate capping layers 206, the gate spacers 208, and the substrate 200 as stop layers to simultaneously form bit line contact holes ($C_B$) 223 on the memory array region 30 to expose the substrate 200 and the gate spacers 208 and form substrate contact holes ($C_S$) 227 and gate contact holes ($C_G$) 225 on the peripheral circuit region 40 to expose the substrate 200 and the gate capping layers 206, respectively.

Figure 2D:
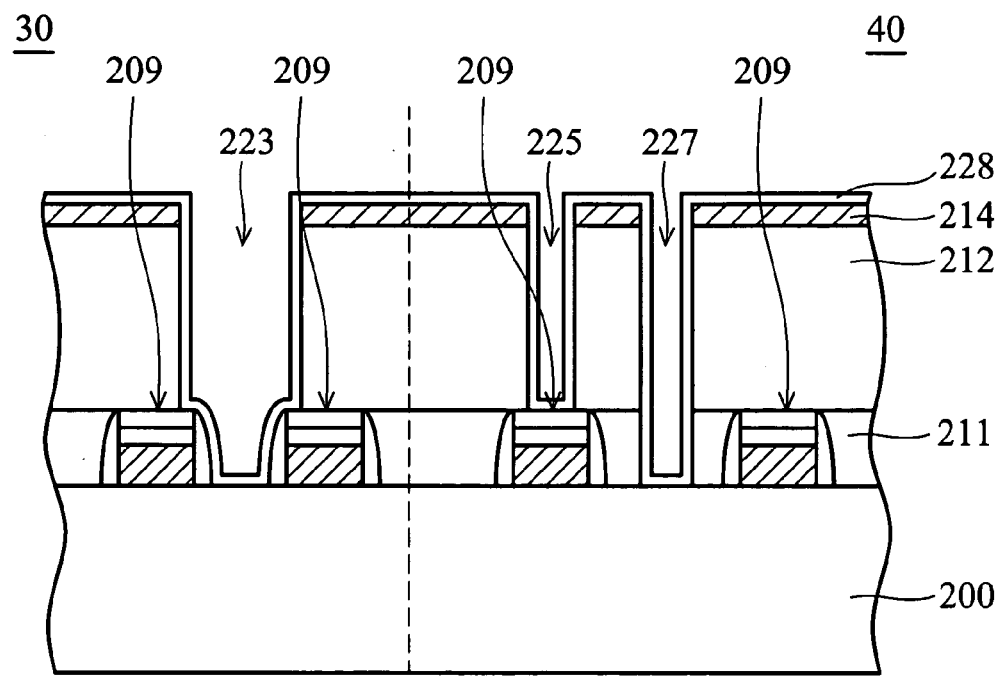
Figure 2E:
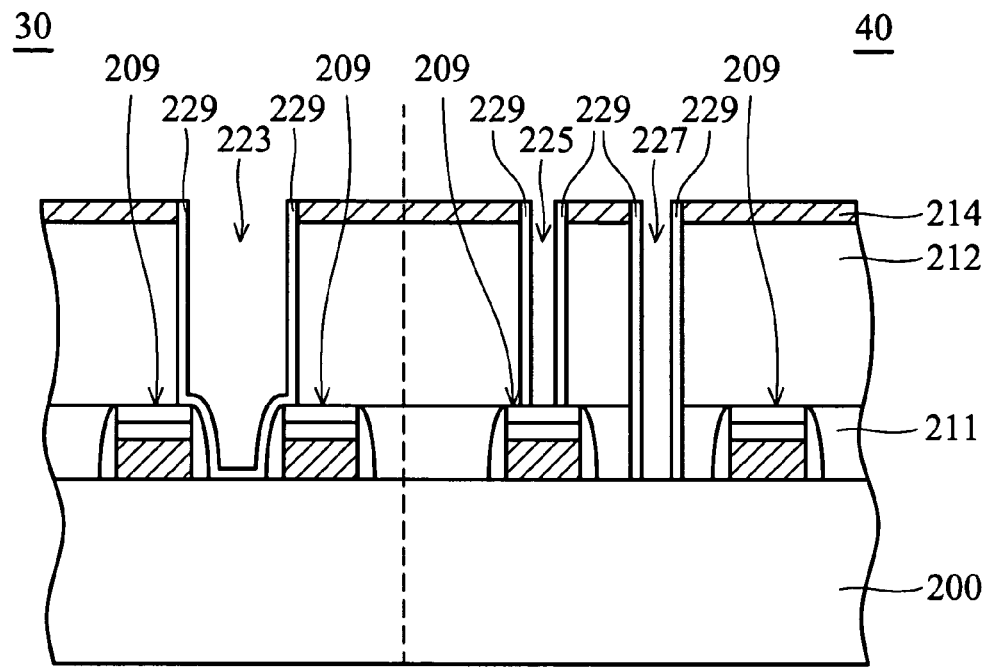

FIGS. 2d to 2e illustrate the critical steps of the invention. In FIG. 2d, a conformable metal nitride layer 228 is formed on the hard mask 214 and the inner surfaces of the bit line contact holes 223, the substrate contact holes 227, and the gate contact holes 225 by conventional deposition, such as CVD. In the invention, the metal nitride layer 228 may comprise titanium nitride and has a thickness of about 80 to 200Å, with 100Å being preferable.

Next, in FIG. 2e, anisotropic etching, such as reactive ion etching (RIE), is performed on the metal nitride layer 228 using, for example, BCl, $CL_2$, HBr, and $N_2$ as reaction gases to form protective spacers 229 over the sidewalls of the bit line contact holes 223, the substrate contact holes 227, and the gate contact holes 225, respectively.

Figure 2F:
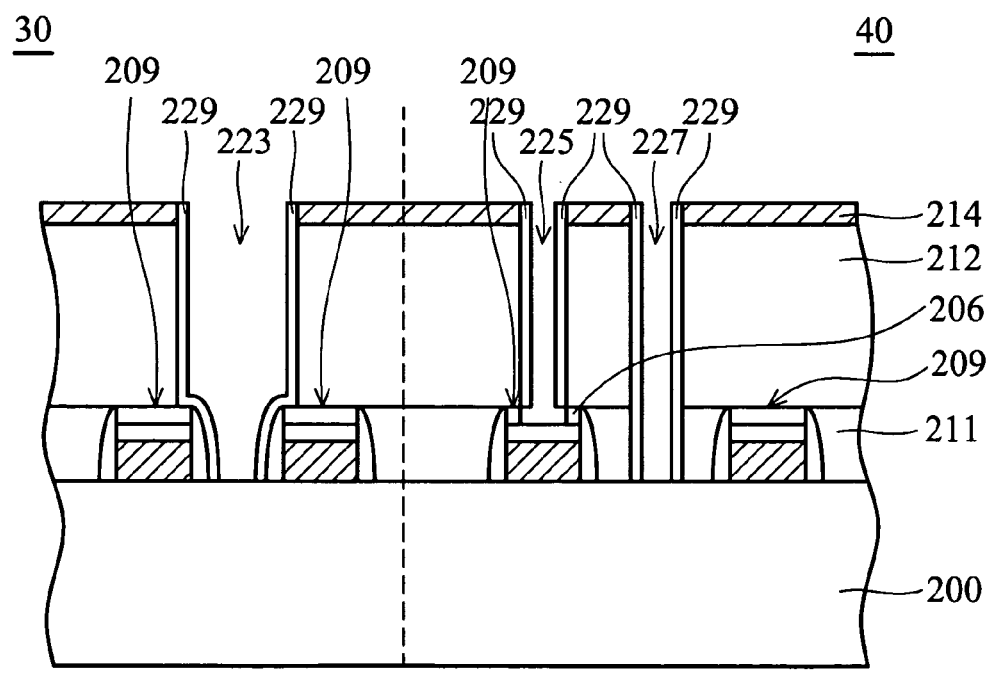

Next, in FIG. 2f, the protective spacer 209 comprising titanium nitride can be used as a stop layer during etching of the gate capping layer 206 comprising silicon nitride under the gate contact hole 225 using $CH_3F$, $O_2$, CO as reaction gases because of the high etching selectivity of silicon nitride to titanium nitride. After etching, the metal silicide layer 204 of the gate 205 is exposed to complete the fabrication of the gate contact hole 225.

In the invention, since the protective spacer 229 protects the gate capping layer 206 and the gate spacer 208 under the bit line contact hole 223 during etching of the exposed gate capping layer 206 under the gate contact hole 225, there is no need to form an additional photoresist layer in the bit line contact hole 223 and the substrate contact hole 227 to severe as a masking layer, as mentioned in the related art. Additionally, it is noted that although titanium nitride is used for the protective spacer in the invention, it is to be understood that the invention is not limited thereto. Any material having low etching rate respective to the silicon nitride by a predetermined etchant can be used for the protective spacer according to the invention.

Figure 2G:
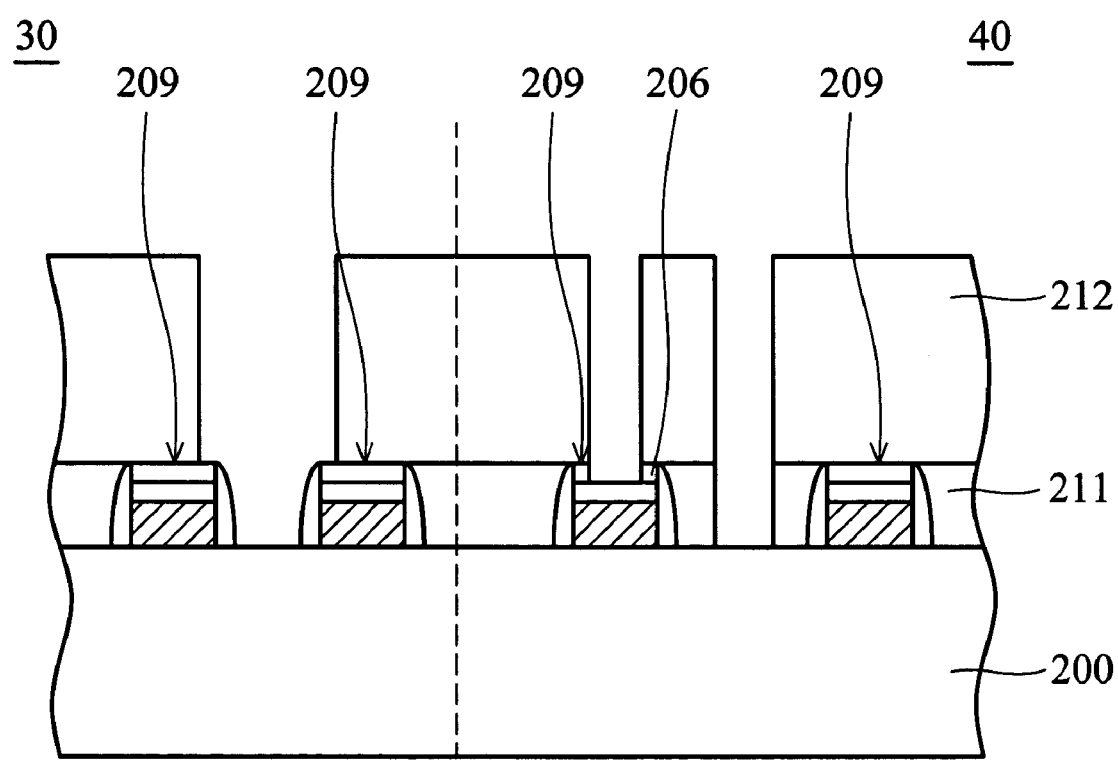

Finally, in FIG. 2g, since the protective spacers 229 can reduce the critical dimension (CD) of the bit line contact hole 223, the substrate contact hole 227, and the gate contact hole 225, the protective spacers 229 require removal prior to formation of the contact plugs. Additionally, since the etch selectivity of the titanium nitride to silicon nitride is about 50:1 by the solution of sulfuric acid and hydrogen peroxide (SPM), the protective spacer 229 in the invention can be removed without damaging the gate capping layer 206 and the gate spacer 208 comprising silicon nitride by SPM solution. In the invention, the SPM solution used has a temperature of about 80 to 120° C., wherein the volumetric ratio of sulfuric acid and hydrogen peroxide is about 4~8:1.

According to the invention, since a protective spacer is formed over the sidewall of the bit line contact hole in the memory device, there is no need to form an additional masking layer before etching the gate capping layer under the gate contact hole. That is, it is not required to perform lithography to form the photoresist masking layer, thereby simplifying the fabrication of contact holes and reducing fabricating cost. Moreover, since there is no requirement to form the masking layer, misalignment is prevented, thereby increasing device yield. Additionally, the protective spacer in the invention can be removed by SPM solution. Accordingly, the critical dimension of the bit line contact hole is not narrowed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming contact holes for a memory device, comprising the steps of:
    providing a substrate having a memory array region and a peripheral circuit region, a plurality of gate structures formed overlying the array region and the peripheral circuit region, wherein the gate structure comprises a gate, a gate capping layer, and a gate spacer;
    forming a first insulating layer between the gate structures;
    forming a second insulating layer on the gate structures and the first insulating layer;
    successively etching the second and first insulating layers using the gate capping layers, the gate spacers, and the substrate as stop layers to form bit line contact holes on the memory array region to expose the substrate and the gate spacers and form substrate contact holes and gate contact holes on the peripheral circuit region to expose the substrate and the gate capping layers;
    forming a protective spacer over each sidewall of the bit line contact holes, the substrate contact holes, and the gate contact holes;
    etching the gate capping layer under each gate contact hole using the protective spacer as a stop layer to expose the gate; and
    removing the protective spacers.

2. The method as claimed in claim 1, further forming a hard mask on the second insulating layer.

3. The method as claimed in claim 2, wherein the hard mask is a polysilicon layer.

4. The method as claimed in claim 1, wherein the gate comprises a metal silicide layer.

5. The method as claimed in claim 1, wherein the gate capping layer and the gate spacer are silicon nitride layers.

6. The method as claimed in claim 1, wherein the first insulating layer is a borophosphosilicate glass (BPSG) layer.

7. The method as claimed in claim 1, wherein the second insulating layer is a tetraethyl orthosilicate (TEOS) oxide layer.

8. The method as claimed in claim 1, wherein the protective spacer is a metal nitride spacer.

9. The method as claimed in claim 8, wherein formation of the protective spacers comprises the steps of:
    forming a conformable metal nitride layer on the second insulating layer and the inner surfaces of the bit line contact holes, the substrate contact holes, and the gate contact holes; and
    anisotropically etching the metal nitride layer using the BCl, $CL_2$, HBr, and $N_2$ as reaction gases to form the protective spacers.

10. The method as claimed in claim 8, wherein the protective spacer is a titanium nitride layer.

11. The method as claimed in claim 10, wherein the protective spacer is removed by a mixture of sulfuric acid and hydrogen peroxide (SPM).

12. The method as claimed in claim 1, wherein the protective spacer has a thickness of about 80 to 200Å.

13. The method as claimed in claim 10, wherein the gate capping layer is etched using CH3F, O2, and CO as reaction gases.

14. A method of forming contact holes, comprising the steps of:
    providing a substrate on which a plurality of gate structures is formed, wherein the gate structure comprises a gate, a gate capping layer, and a gate spacer;
    forming an insulating layer on the gate structures and filling between the gate structures;
    etching the insulating layer using the gate capping layers, the gate spacers, and the substrate as stop layers to form first contact holes between the gate structures to expose the substrate and the gate spacers and form second contact holes overlying each gate structure to expose the gate capping layers;
    forming a protective spacer over each sidewall of the first contact holes and the second contact holes;
    etching the gate capping layer under each gate contact hole using the protective spacer as a stop layer to expose the gate; and
    removing the protective spacers.

15. The method as claimed in claim 14, further forming a hard mask on the insulating layer.

16. The method as claimed in claim 15, wherein the hard mask is a polysilicon layer.

17. The method as claimed in claim 14, wherein the gate comprises a metal silicide layer.

18. The method as claimed in claim 14, wherein the gate capping layer and the gate spacer are silicon nitride layers.

19. The method as claimed in claim 14, wherein the insulating layer comprises borophosphosilicate glass (BPSG).

20. The method as claimed in claim 14, wherein the insulating layer comprises tetraethyl orthosilicate (TEOS) oxide.

21. The method as claimed in claim 14, wherein the protective spacer is a metal nitride spacer.

22. The method as claimed in claim 21, wherein the formation of the protective spacers comprises the steps of:
    forming a conformable metal nitride layer on the insulating layer and the inner surfaces of the first contact holes and the second contact holes; and
    anisotropically etching the metal nitride layer using BCl, $CL_2$, HBr, and $N_2$ as reaction gases to form the protective spacers.

23. The method as claimed in claim 21, wherein the protective spacer is a titanium nitride layer.

24. The method as claimed in claim 23, wherein the protective spacer is removed by a mixture of sulfuric acid and hydrogen peroxide (SPM).

25. The method as claimed in claim 14, wherein the protective spacer has a thickness of about 80 to 200Å.

26. The method as claimed in claim 14, wherein the gate capping layer is etched using CH3F, O2, and CO as reaction gases.

* * * * *